(12) United States Patent
Lin et al.

(10) Patent No.: US 10,910,285 B2
(45) Date of Patent: Feb. 2, 2021

(54) PACKAGE STRUCTURE WITH TFTS AND DIE COVERED RDL

(71) Applicant: InnoLux Corporation, Miao-Li County (TW)

(72) Inventors: Yi-Hung Lin, Miao-Li County (TW); Chien-Chang Lu, Miao-Li County (TW); Cheng-I Wu, Miao-Li County (TW); Li-Wei Sung, Miao-Li County (TW); Cheng-Chi Wang, Miao-Li County (TW); Chin-Lung Ting, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 137 days.

(21) Appl. No.: 15/943,736

(22) Filed: Apr. 3, 2018

(65) Prior Publication Data

US 2018/0323126 A1 Nov. 8, 2018

Related U.S. Application Data

(60) Provisional application No. 62/501,758, filed on May 5, 2017.

(30) Foreign Application Priority Data

Nov. 30, 2017 (CN) .......................... 2017 1 1241412

(51) Int. Cl.
*H01L 23/31* (2006.01)
*H01L 23/00* (2006.01)
(Continued)

(52) U.S. Cl.
CPC ...... *H01L 23/3107* (2013.01); *H01L 23/3114* (2013.01); *H01L 24/27* (2013.01); *H01L 24/29* (2013.01); *H01L 24/32* (2013.01); *H01L 25/0657* (2013.01); *H01L 27/0266* (2013.01); *H01L 27/1207* (2013.01); *H01L 24/13* (2013.01); *H01L 24/16* (2013.01); *H01L 2224/024* (2013.01); *H01L 2224/0231* (2013.01); *H01L 2224/0239* (2013.01); *H01L 2224/02331* (2013.01); *H01L 2224/02371* (2013.01); *H01L 2224/13111* (2013.01);
(Continued)

(58) Field of Classification Search
CPC ............. H01L 23/3114; H01L 25/0657; H01L 2224/0231; H01L 2224/02371; H01L 2225/06517; H01L 2225/06568; H01L 2225/06513
See application file for complete search history.

(56) References Cited

U.S. PATENT DOCUMENTS

2005/0121796 A1* 6/2005 Park .................... H01L 23/4985
257/773
2010/0149473 A1* 6/2010 Guo ...................... G02F 1/1345
349/122
(Continued)

*Primary Examiner* — John P. Dulka
(74) *Attorney, Agent, or Firm* — Winston Hsu

(57) ABSTRACT

The present disclosure provides a package structure including a redistribution layer and a die. The redistribution layer includes a switch circuit portion and a redistribution portion, the switch circuit portion includes a transistor, and the redistribution portion is adjacent to the switch circuit portion. The die overlaps the redistribution portion, wherein the transistor is electrically connected to the die.

19 Claims, 9 Drawing Sheets

(51) Int. Cl.
*H01L 27/02* (2006.01)
*H01L 25/065* (2006.01)
*H01L 27/12* (2006.01)

(52) U.S. Cl.
CPC .............. *H01L 2224/16227* (2013.01); *H01L 2224/16238* (2013.01); *H01L 2224/81193* (2013.01); *H01L 2924/15311* (2013.01)

(56) References Cited

U.S. PATENT DOCUMENTS

| | | | |
|---|---|---|---|
| 2011/0273410 A1* | 11/2011 | Park ...................... | H01L 25/167 345/204 |
| 2016/0095221 A1* | 3/2016 | Ramachandran ... | H01L 27/1218 361/783 |
| 2017/0131604 A1* | 5/2017 | Cao ...................... | H01L 27/1259 |
| 2017/0219899 A1* | 8/2017 | Furukawa ......... | G02F 1/133345 |
| 2018/0307355 A1* | 10/2018 | Kim ...................... | G06F 3/0412 |

* cited by examiner

PACKAGE STRUCTURE WITH TFTS AND DIE COVERED RDL

CROSS REFERENCE TO RELATED APPLICATION

This patent application claims the benefit of U.S. Provisional Application No. 62/501,758, filed on May 5, 2017, the entire contents of which are incorporated herein by reference.

BACKGROUND OF THE DISCLOSURE

1. Field of the Disclosure

The present disclosure relates to a package structure, and more particularly to a redistribution layer of a package structure having a transistor.

2. Description of the Prior Art

As the evolution and development of electronic products, the electronic products have become an indispensable item in these days, wherein chips are widely used in the electronic products. In order to protect die for reducing structural damage, the die will be packaged into a chip after completing manufacturing process of the die, and furthermore, an electrical path from the die to external components, such as connecting pads electrically connected to bonding pads of the die, may be more flexible through the arrangement of the conductive films. However, as the package structure is shrunk more and more and the complexity of the chip function increases day by day, miniaturizing the package structure and doing an accurate test to the die before completing package are still in need of being achieved simultaneously.

SUMMARY OF THE DISCLOSURE

According to an embodiment, the present disclosure provides a package structure including a redistribution layer (RDL) and a die. The redistribution layer includes a switch circuit portion and a redistribution portion, the switch circuit portion includes a transistor, and the redistribution portion is adjacent to the switch circuit portion. The die overlaps the redistribution portion, wherein the transistor is electrically connected to the die.

According to another embodiment, the present disclosure provides a package structure including a die, a first transistor, a second transistor, a first control node, a second control node and at least one input and output end. The die includes a plurality of die ends, wherein the die ends include a first die end and a second die end. The first transistor includes a switch control end, a first end and a second end, wherein the first end of the first transistor is electrically connected to the first die end. The second transistor includes a switch control end, a first end and a second end, wherein the first end of the second transistor is electrically connected to the second die end. The first control node is electrically connected to the switch control end of the first transistor. The second control node is electrically connected to the switch control end of the second transistor. The at least one input and output end includes a first input and output end, wherein the first input and output end is electrically connected to the second end of the first transistor and the second end of the second transistor.

These and other objectives of the present disclosure will no doubt become obvious to those of ordinary skill in the art after reading the following detailed description of the embodiment that is illustrated in the various figures and drawings.

DETAILED DESCRIPTION

Figure 1:
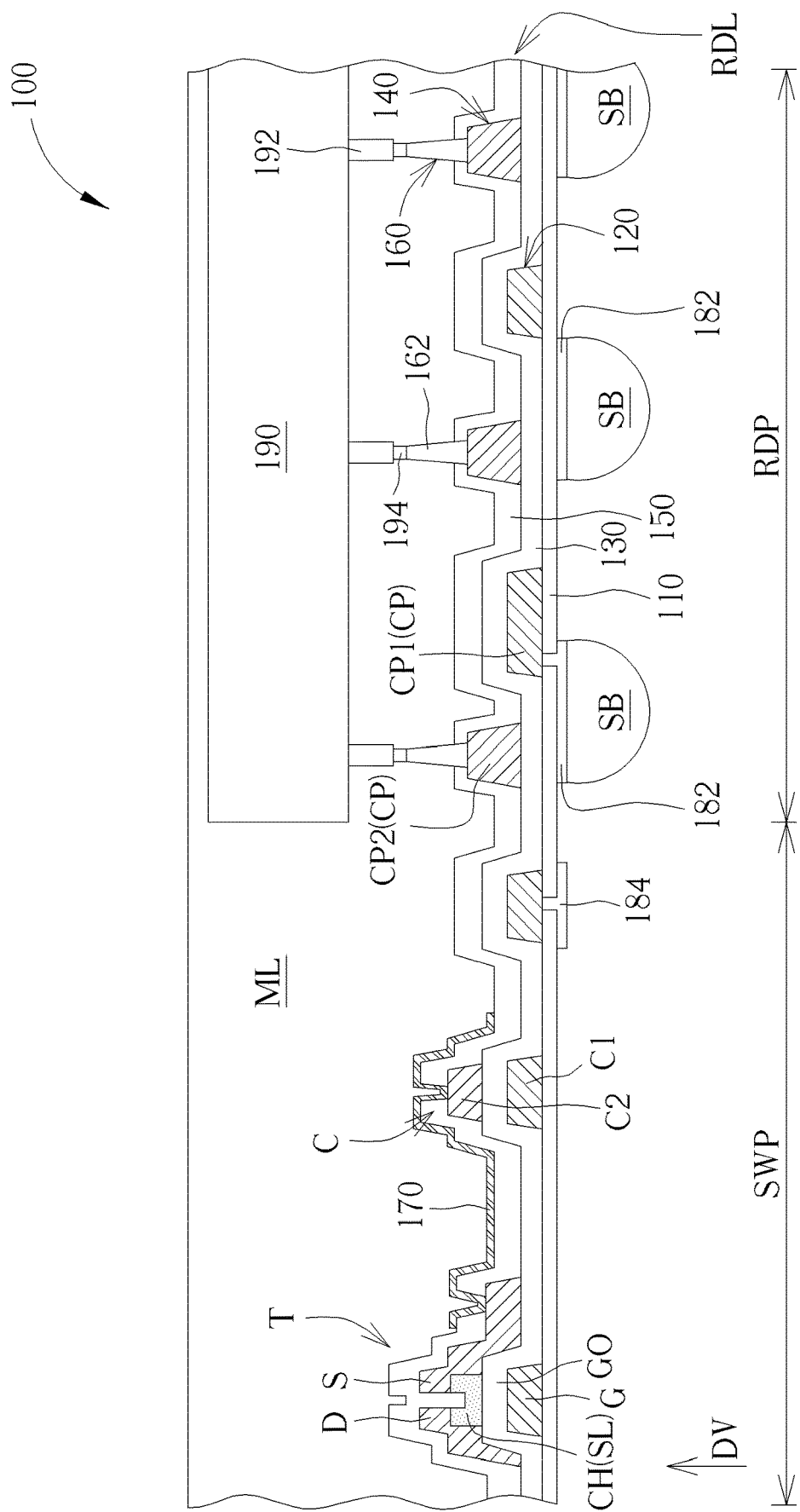
FIG. 1 is a schematic diagram showing a cross-section of a package structure according to a first embodiment of the present disclosure.

To provide a better understanding of the present disclosure to the skilled users in the technology of the present disclosure, embodiments will be detailed as follows. The embodiments of the present disclosure are illustrated in the accompanying drawings with numbered elements to elaborate on the contents and effects to be achieved. It is needed to note that the drawings are simplified schematic, and therefore, the drawings show only the components and combinations associated with the present disclosure, so as to provide a clearer description of the basic architecture or method of implementation of the present disclosure. The components would be complex in reality. In addition, in order to explain, the components shown in the drawings of the present disclosure are not drawn to the actual number, shape, and dimensions, and the detail can be adjusted according to the design requirements.

When the terms "include", "comprise" and/or "have" are used in the description of the present disclosure, it indicates that the existence of the corresponding features, areas/regions, steps, operations and/or components, without excluding the existence or addition of one or a plurality of other features, areas/regions, steps, operations and/or components. When the corresponding component such as layer or area/region is referred to "on another component (or the variant thereof)" or "extend to another component", it may be disposed directly on another component or directly extend to another component, or other component may exist therebetween. On the other hand, when the component is referred to be "directly on another component (or the variant thereof)" or "directly extend to another component", there is no other component existing therebetween. In addition, when the component is referred to "be electrically connected to another component (or the variant thereof)", it may be directly connected to another component, or may be indirectly connected to another component through other component or components.

Referring to FIG. 1, FIG. 1 is a schematic diagram showing a cross-section of a package structure according to a first embodiment of the present disclosure. As shown in FIG. 1, the package structure 100 of this embodiment includes a redistribution layer RDL and a die 190, the redistribution layer RDL includes a redistribution portion RDP and a switch circuit portion SWP. The switch circuit portion SWP includes a transistor T and is adjacent to the redistribution portion RDP; for example, the switch circuit portion SWP may be disposed at a side of the redistribution portion RDP, but the present disclosure is not limited thereto. In order to clearly show the package structure 100, FIG. 1 shows one transistor T, which is a thin film transistor for example, but the present disclosure is not limited thereto. The number of the transistors T of the present disclosure may be determined according to requirements, and details may be described in following different embodiments. In this embodiment, the redistribution portion RDP and the switch circuit portion SWP are different portions of the redistribution layer RDL and adjacent to each other, but the present disclosure is not limited thereto. The die 190 is situated on and bonded to the redistribution layer RDL, and the die 190 overlaps the redistribution portion RDP along a top view direction DV of the redistribution layer RDL, wherein the die 190 has a plurality of bonding pads 192. Through the redistribution layer RDL, signal contact points input signals to the die 190 or signal contact points received signals from the die 190 may be rearranged or the distance between the signal contact points may be enlarged, so as to facilitate electrical connection to the die 190 in subsequent applications.

The redistribution layer RDL may include a plurality of conductive films and a plurality of insulating films for rearranging the signal contact points or enlarging the distance between the signal contact points. In this embodiment, the redistribution portion RDP may include a plurality of conductive patterns CP, and the conductive patterns CP and the transistor T are formed of the conductive films and the insulating films in the redistribution layer RDL, wherein the transistor T is electrically connected to the die 190 through the conductive patterns CP. In details, in this embodiment, the redistribution layer RDL may include a first insulating layer 110, a first conductive layer 120, a second insulating layer 130, a semiconductor layer SL, and a second conductive layer 140, in which the first conductive layer 120 is disposed on the first insulating layer 110, the second insulating layer 130 is disposed on the first conductive layer 120, the semiconductor layer SL is disposed on the second insulating layer 130, and the second conductive layer 140 is disposed on the second insulating layer 130. The second conductive layer 140 of this embodiment is further disposed on the semiconductor layer SL, but the present disclosure is not limited thereto. In another embodiment, a portion of the second conductive layer 140 may be disposed between the semiconductor layer SL and the second insulating layer 130. In FIG. 1, the transistor T of the switch circuit portion SWP of this embodiment is a bottom gate transistor for example, and therefore, a gate G of the transistor T may be formed of the first conductive layer 120, a gate insulating layer GO may be formed of the second insulating layer 130, a semiconductor channel CH may be formed of the semiconductor layer SL, and a source S and a drain D may be formed of the second conductive layer 140, but the type of the transistor T and the forming method are not limited thereto. In another embodiment, the transistor T of the switch circuit portion SWP may be other type transistor, such as a top gate transistor.

Regarding to the conductive patterns CP, the conductive patterns CP may be formed of the first conductive layer 120, the second conductive layer 140, the semiconductor layer SL or other conductive film of the redistribution layer RDL, and the conductive patterns CP may be formed as single-layer or multi-layer conductive structures. In this embodiment, each conductive pattern CP is a single-layer conductive structure, the conductive patterns CP may include at least one first conductive pattern CP1 and at least one second conductive pattern CP2, the at least one first conductive pattern CP1 includes a same material as the first conductive layer 120, and the at least one second conductive pattern CP2 includes a same material as the second conductive layer 140. For example, the conductive patterns CP may include a plurality of first conductive patterns CP1 and a plurality of second conductive patterns CP2, the first conductive patterns CP1 may be formed as single-layer conductive structures by the first conductive layer 120, and thus, the first conductive patterns CP1 and the gate G of the transistor T are formed of the same layer (the first conductive layer 120). Accordingly, the material of each of the first conductive patterns CP1 is the same as the material of the first conductive layer 120. Also, the second conductive patterns CP2 may be formed as single-layer conductive structures by the second conductive layer 140, and thus, the second conductive patterns CP2 and the source S and the drain D of the transistor T are formed of the same film (the second conductive layer 140). Accordingly, the material of each of the second conductive pattern CP2 is the same as the material of the second conductive layer 140, but the present disclosure is not limited thereto. The conductive patterns CP of the present disclosure may only include the first conductive pattern CP1 or the second conductive pattern CP2. In this embodiment, the conductive patterns CP may extend into the switch circuit portion SWP, so as to be electrically connected to the gate G, the source S or the drain D of the transistor T.

Moreover, the redistribution layer RDL of this embodiment may further include another conductive films (such as a third conductive layer 160 shown in FIG. 1), another insulating films (such as a third insulating layer 150 shown in FIG. 1) or other required films, Or, the layers or the films described above may be disposed by different stacking methods. For example, the third insulating layer 150 is disposed on the second conductive layer 140 and the second insulating layer 130, and the third insulating layer 150 may have openings for exposing the second conductive patterns CP2. The third conductive layer 160 within the redistribution portion RDP may include a plurality of conductive pads 162 electrically connected to the corresponding second conductive patterns CP2 through the openings respectively, and the conductive pads 162 are disposed to face the bonding pads 192 of the die 190. Each of the conductive pads 162 may be respectively bonded with the corresponding bonding pad 192 of the die 190 by bonding material 194, such as tin, such that each of the conductive pads 162 may be configured to electrically connect the corresponding bonding pad 192 of the die 190 to the corresponding second conductive pattern CP2. Furthermore, this bonding method may be such as a eutectic bonding method. In another embodiment, the third insulating layer 150 and the second insulating layer 130 may have openings for exposing the first conductive patterns CP1 respectively, each conductive pad 162 may be electrically connected to the corresponding first conductive pattern CP1 through the opening, and therefore, the conductive pads 162 may be configured to electrically connect the bonding pads 192 of the die 190 to the corresponding first conductive patterns CP1.

In addition, the package structure 100 of this embodiment may further include at least one outer connecting pad 182 disposed at a side of the redistribution layer RDL opposite the die 190 (situated below of the first insulating layer 110 shown in FIG. 1), and the outer connecting pads 182 are situated within the redistribution portion RDP, but the present disclosure is not limited thereto. The conductive patterns CP may further be electrically connected between the bonding pads 192 of the die 190 and the outer connecting pads 182. For example, the outer connecting pads 182 may be electrically connected to the first conductive patterns CP1 through the openings of the first insulating layer 110, so as to be electrically connected to the transistor T through the first conductive patterns CP1. Thus, the bonding pads 192 of the die 190 may be electrically connected to the transistor T and the outer connecting pads 182 through the conductive patterns CP. The positions of the outer connecting pads 182 electrically connected to the bonding pads 192 may be designed depending on requirements. For instance, a distance between the outer connecting pads 182 may greater than a distance between the bonding pads 192 of the die 190, such that the die 190 is connected to the external component flexibly. Moreover, the package structure 100 of this embodiment may selectively include at least one solder ball SB disposed on the outer connecting pad 182, such that the connection accuracy can be improved when the package structure 100 is connected to other external structures (such as the package structure 100 is disposed on a circuit board). In this embodiment, the package structure 100 may further include an encapsulation layer ML covering the die 190, the redistribution portion RDP and the switch circuit portion SWP; that is to say, the encapsulation layer ML covers the die 190 and the redistribution layer RDL to encapsulate the die 190 on the redistribution layer RDL, and the encapsulation layer ML covers circuits exposing on the redistribution portion RDP and the switch circuit portion SWP to protect the circuits of the package structure 100, but the disposition of the encapsulation layer ML is not limited thereto.

In a manufacturing process of the package structure 100 of this embodiment, the first insulating layer 110 may be provided firstly, wherein the first insulating layer 110 may be a substrate, such as a rigid substrate including a glass substrate, a quartz substrate or a sapphire substrate, or a flexible substrate including polyimide (PI), polycarbonate (PC) or polyethylene terephthalate (PET) for example. Next, the first conductive layer 120, the second insulating layer 130, the semiconductor layer SL and the second conductive layer 140 are formed on the first insulating layer 110. For instance, the first conductive layer 120 is covered on the first insulating layer 110, and the patterned first conductive layer 120 is formed by photolithography, so as to complete the manufacture of the first conductive patterns CP1. Then, the second insulating layer 130 is covered on the first conductive layer 120, the semiconductor layer SL is covered on the second insulating layer 130, and the patterned semiconductor layer SL is formed by photolithography. Thereafter, the second conductive layer 140 is covered on the semiconductor layer SL, and the patterned second conductive layer 140 is formed by photolithography, so as to complete the manufacture of the second conductive patterns CP2 and the transistor T. In this embodiment, the third insulating layer 150 may be formed on the second conductive layer 140, and the openings are formed in the third insulating layer 150 by photolithography. Thereafter, the third conductive layer 160 is covered on the third insulating layer 150 and the second conductive layer 140, and the patterned third conductive layer 160 is formed by photolithography, such that the redistribution layer RDL is formed completely. Then, the outer connecting pads 182 are formed below the first insulating layer 110. At least two of the first conductive layer 120, the second conductive layer 140, the third conductive layer 160 and the outer connecting pad 182 may be formed of the same metal material or different metal materials, or may be formed according to different process conditions; for example, the first conductive layer 120 and the second conductive layer 140 may be formed of copper, and the third conductive layer 160 and the outer connecting pad 182 may be formed of aluminum, but the present disclosure is not limited thereto. The insulating films such as the second insulating layer 130 and the third insulating layer 150 may be formed of insulating material such as silicon oxide or silicon nitride, but the present disclosure is not limited thereto. Furthermore, when another conductive film is formed, the material of this conductive film may be the same as one of the first conductive layer 120, the second conductive layer 140, the third conductive layer 160 and the outer connecting pad 182 or different from the first conductive layer 120, the second conductive layer 140, the third conductive layer 160 and the outer connecting pad 182.

After forming the redistribution layer RDL, the die 190 is disposed on the redistribution layer RDL, and the bonding pads 192 of the die 190 are electrically connected to the exposing conductive pads 162 (for example, through the bonding materials 194), such that the die 190 is electrically connected to the transistor T, and the die 190 is connected to the external flexibly. Thereafter, the encapsulation layer ML is covered on the die 190, the redistribution portion RDP and the switch circuit portion SWP, but the manufacturing method is not limited thereto. In another embodiment, the conductive films and the insulating films described above may be directly formed on a side of the die 190 having the bonding pads 192 to form the conductive patterns CP, the transistor T and the outer connecting pads 182, and the manufacture of the package structure 100 is completed. Moreover, since manufacturing variations inevitably occur during the manufacturing process, the thicknesses of the semiconductor channel CH, the source S, the drain D and the gate G of the transistor T may be different from the thickness of the conductive patterns CP whether these structures of the transistor T and the conductive patterns CP are formed of the same film or not, but the present disclosure is not limited thereto.

Figure 2:
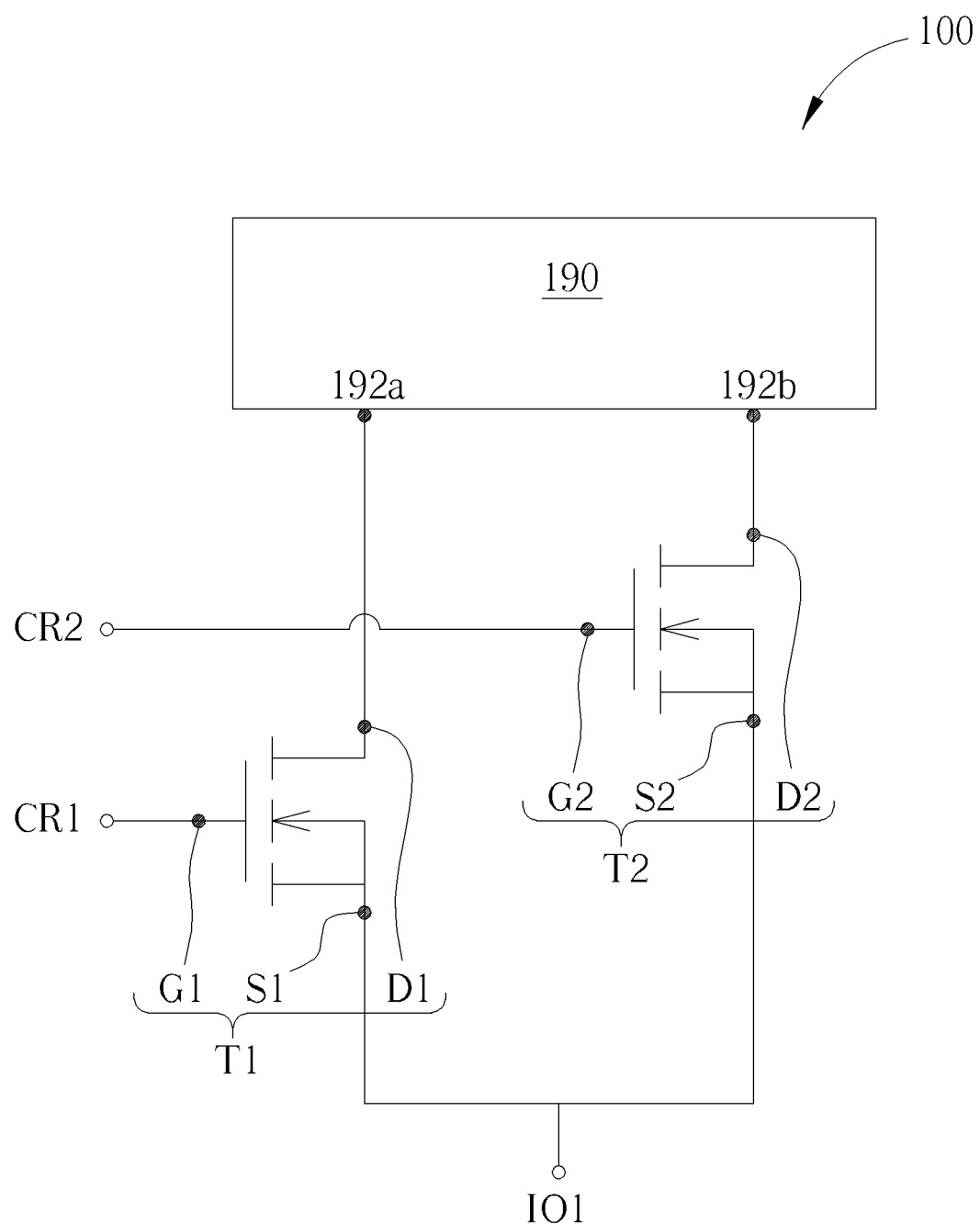
FIG. 2 is a schematic diagram showing a circuit of the package structure according to the first embodiment of the present disclosure.

Referring to FIG. 2, FIG. 2 is a schematic diagram showing a circuit of the package structure of the first embodiment of the present disclosure. As shown in FIG. 1 and FIG. 2, the package structure 100 of this embodiment includes the die 190, a first transistor T1, a second transistor T2, a first control node CR1, a second control node CR2 and at least one input and output end, the design of the circuit structure of the package structure 100 will be described below. The die 190 includes a plurality of die ends, and each of the bonding pads 192 of the die 190 of this embodiment may be one of the die ends, wherein the die ends may include a first die end 192a and a second die end 192b. The first transistor T1 has a switch control end, a first end and a second end, and the second transistor T2 has a switch control end, a first end and a second end. In this embodiment, the first transistor T1 and the second transistor T2 may be disposed in the redistribution layer RDL, that is to say, each of the first transistor T1 and the second transistor T2 may be the transistor T shown in FIG. 1, so the switch control end may be the gate, the first end and the second end may be the drain and the source respectively or may be the source and the drain respectively. In FIG. 2, the first transistor T1 and the second transistor T2 are N-type transistors for example, the drain D1 of the first transistor T1 is electrically connected to the first die end 192a, and the drain D2 of the second transistor T2 is electrically connected to the second die end 192b, but the present disclosure is not limited thereto. In another embodiment, the first transistor T1 and the second transistor T2 may be P-type transistors. In addition, the first control node CR1 and the second control node CR2 are electrically connected between the switch control ends and a control module configured to control the transistor, and the control module may be situated in the package structure 100 or be an external module or an external apparatus. In this embodiment, the first control node CR1 is electrically connected to the gate G1 of the first transistor T1, the second control node CR2 is electrically connected to the gate G2 of the second transistor T2. The input and output end is configured to input signals to the die 190 or output signals provided from the die 190, and the input and output end may be the outer connecting pad 182 of the package structure 100 shown in FIG. 1 for example. That is to say, the outer connecting pad 182 may be configured to be an input terminal inputting the signals to the die 190 or configured to be an output terminal outputting the signals provided from the die 190. In this embodiment, at least one input and output end includes a first input and output end IO1 electrically connected to the source S1 of the first transistor T1 and the source S2 of the second transistor T2. Therefore, the source S1 of the first transistor T1 and the source S2 of the second transistor T2 are electrically connected to the same outer connecting pad 182, and the first input and output end IO1 may be electrically connected to the first die end 192a through the first transistor T1 or be electrically connected to the second die end 192b through the second transistor T2.

In this embodiment, the control module may provide the first control node CR1 and the second control node CR2 with the control signals, which control the switches of the first transistor T1 and the second transistor T2. In other words, the first input and output end IO1 may be chosen to be electrically connected to the first die end 192a and the second die end 192b at the same time, electrically connected to the first die end 192a, or electrically connected to the second die end 192b by controlling the switches of the first transistor T1 and the second transistor T2. In detail, when the control module provides the first control node CR1 with a turn-on signal (such as a high voltage) and provides the second control node CR2 with a turn-off signal (such as a low voltage), the first die end 192a, the first transistor T1 and the first input and output end IO1 (the outer connecting pad 182) may forma conductive path; when the control module provides the first control node CR1 with the turn-off signal and provides the second control node CR2 with the turn-on signal, the second die end 192b, the second transistor T2 and the first input and output end IO1 (the outer connecting pad 182) may form another conductive path; and when the control module provides the first control node CR1 and the second control node CR2 with the turn-on signals, the first die end 192a, the first transistor T1, the first input and output end IO1, the second transistor T2 and the second die end 192b may form a conductive path. It can be known that the conductive paths may be chosen by controlling the signals inputted to the first control node CR1 and the second control node CR2, so as to select the functions or signals provided from the die 190. For instance, the first input and output end IO1 (the outer connecting pad 182) may be configured to respectively output the signals provided from the first die end 192a and the second die end 192b (corresponding to two bonding pads 192 of the die 190) at different times; Or, the first input and output end IO1 may be configured to respectively input the signals (such as a test signal) to the first die end 192a and the second die end 192b in different times or at the same time. Thus, following the design described above, number of the input and output ends of this embodiment may be less than number of the die ends of the die 190, and number of the outer connecting pads 182 of the package structure 100 may be less than number of the bonding pads 192 of the die 190. Compared to a case that each of bonding pads of a conventional die needs to be connected to a respective connecting pad, the numbers of the outer connecting pad 182 of the package structure 100 of this embodiment may be reduced, which reduce the size of the package structure 100.

Moreover, in order to make the function of the circuit more diverse and perfect, the switch circuit portion SWP of the package structure 100 of this embodiment may further include a passive component such as a capacitor or a resistor. The passive component of this embodiment shown in FIG. 1 is a capacitor C for example, wherein the capacitor C is electrically connected to the transistor T, so as to maintain the signal passing through the transistor T.

Furthermore, an electrode of the capacitor C may include the same material as the first conductive layer 120 or the second conductive layer 140. In FIG. 1, a bottom electrode C1 of the capacitor C may be a single-layer conductive structure formed of the first conductive layer 120, and a top electrode C2 may be a single-layer conductive structure formed of the second conductive layer 140, but the present disclosure is not limited thereto. The bottom electrode C1 and the top electrode C2 of this embodiment may be designed to be formed of other conductive film depending on requirements. In addition, the redistribution layer RDL may further include a fourth conductive layer 170 disposed on the third insulating layer 150, and the capacitor C may be electrically connected to the transistor T through the fourth conductive layer 170, wherein the fourth conductive layer 170 may include transparent conductive material for example (such as indium tin oxide, ITO)), but the present disclosure is not limited thereto. The capacitor C and the transistor T may be electrically connected to each other through one of the first conductive layer 120, the second conductive layer 140 and the third conductive layer 160 in another embodiment.

On the other hand, in the conventional package structure, because each of the bonding pads of the die needs to be connected to a respective connecting pad (such as the bonding pads are respectively connected to different connecting pads), it needs to make test probes be in contact with each of connecting pads when testing, so as to confirm whether each of the bonding pads of the die are good. However, if the number of the bonding pads of the die is too many, the number of the test probes is too many also, such that the cost of the test would be increased, and alignment accuracy of the test probes may decline to affect the test results. In another conventional test method, the bonding pads of the die may be tested together by shorting some of the bonding pads, and however, this test method cannot accurately test all of the bonding pads. In this embodiment, since two bonding pads 192 of the die 190 may be electrically connected to the same outer connecting pad 182, the number of the test probes may be reduced in the test, so as to decrease the cost of the test and increase the alignment accuracy of the test probes. Furthermore, because the circuit described above and including the transistor T is disposed in the redistribution layer RDL, one outer connecting pad 182 may be configured to test the two bonding pads 192 at the same time or at different times, so as to enhance the test accuracy. In addition, the die 190 may output the signals with different types such as analog signals and digital signals, and however, testing equipment which can interpret these signals with different types at the same time is complicated and expensive. In this embodiment, since the circuit described above has the function of selecting which the conductive path is formed, the bonding pads 192 outputting the signals with different types may be tested at different times. Accordingly, the cost and the difficulty of the test would be decreased. Moreover, in order to prevent the outer connecting pads 182 from being destroyed by the contact with the test probes when testing and from influencing the disposition of the solder ball SB, in this embodiment, testing connecting pads 184 may be further disposed when forming the outer connecting pads 182, and the testing connecting pads are electrically connected to the corresponding outer connecting pads 182. Accordingly, the testing connecting pads may be used to substitute for the outer connecting pads 182 to be in contact with the test probes when testing. In addition, the number of the outer connecting pads 182 of the package structure 100 of this embodiment may be reduced, and thus, size of the outer connecting pad 182 may be selectively increased in design to enhance alignment accuracy of the test probes.

The package structure of the present disclosure is not limited to the above embodiments. Further embodiments of the present disclosure are described below. For ease of comparison, same components will be labeled with the same symbol in the following. The following descriptions relate the differences between each of the embodiments, and repeated parts will not be redundantly described.

Figure 3:
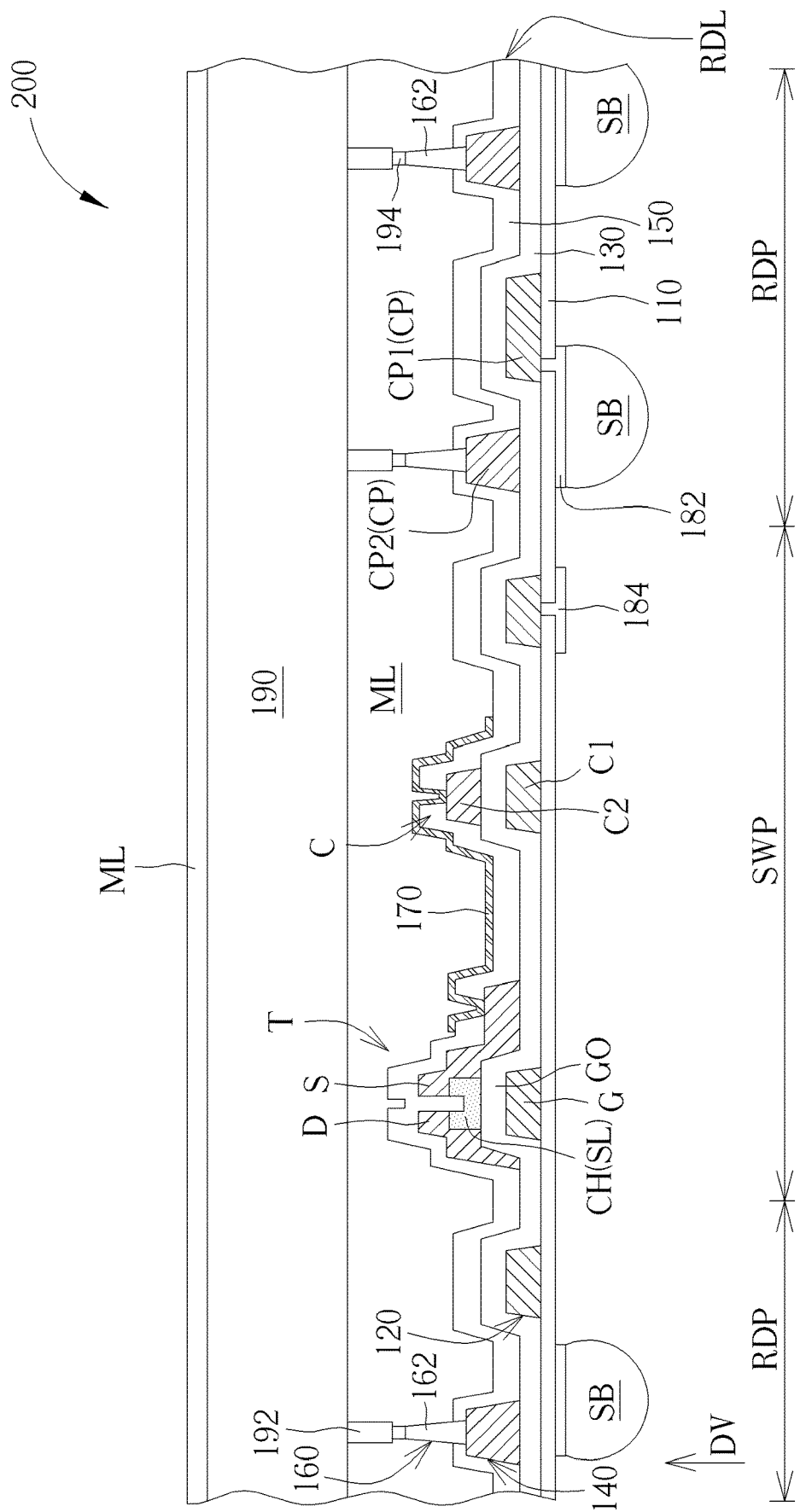
FIG. 3 is a schematic diagram showing a cross-section of a package structure according to a second embodiment of the present disclosure.

Referring to FIG. 3, FIG. 3 is a schematic diagram showing a cross-section of a package structure according to a second embodiment of the present disclosure. As shown in FIG. 3, compared to the first embodiment, the die 190 of this embodiment overlaps at least a portion of the switch circuit portion SWP along the top view direction DV, and thus, at least a portion of the switch circuit portion SWP and at least a portion of the redistribution portion RDP overlap the die 190. For example, the redistribution portion RDP may surround the switch circuit portion SWP, and the die 190 completely overlaps the switch circuit portion SWP, but the present disclosure is not limited thereto. In this embodiment, although the package structure 200 has the switch circuit portion SWP, in this configuration, the switch circuit portion SWP may be situated under the die 190, such that the size of the package structure 200 may be reduced.

Figure 4:
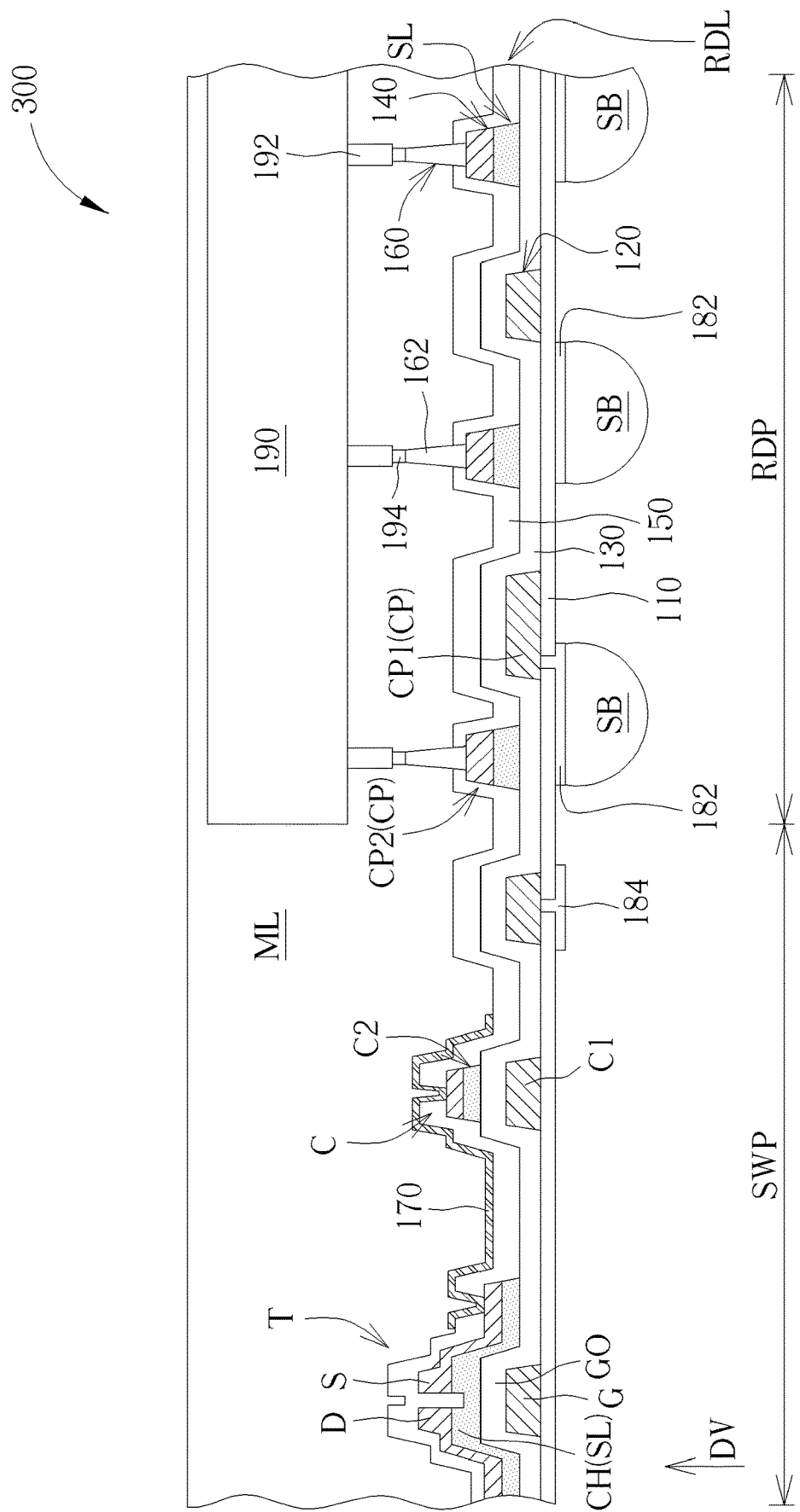
FIG. 4 is a schematic diagram showing a cross-section of a package structure according to a third embodiment of the present disclosure.

Referring to FIG. 4, FIG. 4 is a schematic diagram showing a cross-section of a package structure according to a third embodiment of the present disclosure. As shown in FIG. 4, compared to the first embodiment, at least one of the conductive patterns CP of the package structure 300 of this embodiment may be a multi-layer conductive structure. For example, in this embodiment, the second conductive patterns CP2, the top electrode C2 of the capacitor C may be the multi-layer conductive structures formed of the second conductive layer 140 and the semiconductor layer SL; that is to say, the second conductive patterns CP2 may be formed by using photolithography to pattern the second conductive layer 140 and the semiconductor layer SL at the same time. Therefore, the second conductive patterns CP2 may include the same material as the second conductive layer 140 and the same material as the semiconductor layer SL, but the present disclosure is not limited thereto. In FIG. 1 and FIG. 4, at least one of the conductive patterns CP may have the same material as at least one of the conductive films and the semiconductor layer SL and may be single-layer or multi-layer structures. Furthermore, since the second conductive patterns CP2 of this embodiment are the multi-layer conductive structures formed of the second conductive layer 140 and the semiconductor layer SL, a thickness of each second conductive pattern CP2 is different from a thickness of the semiconductor channel CH of the transistor T.

Figure 5:
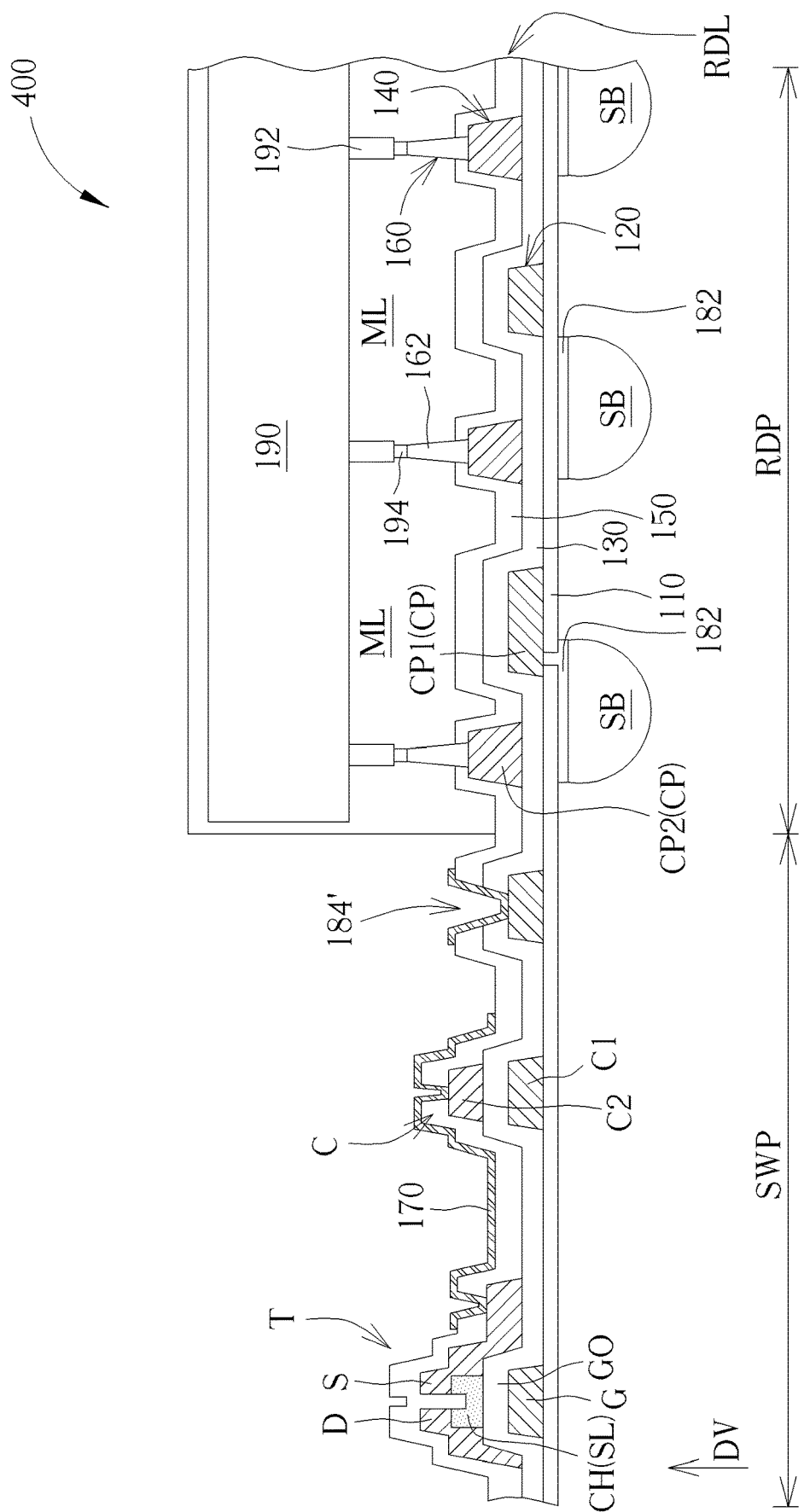
FIG. 5 is a schematic diagram showing a cross-section of a package structure according to a fourth embodiment of the present disclosure.
Figure 6:
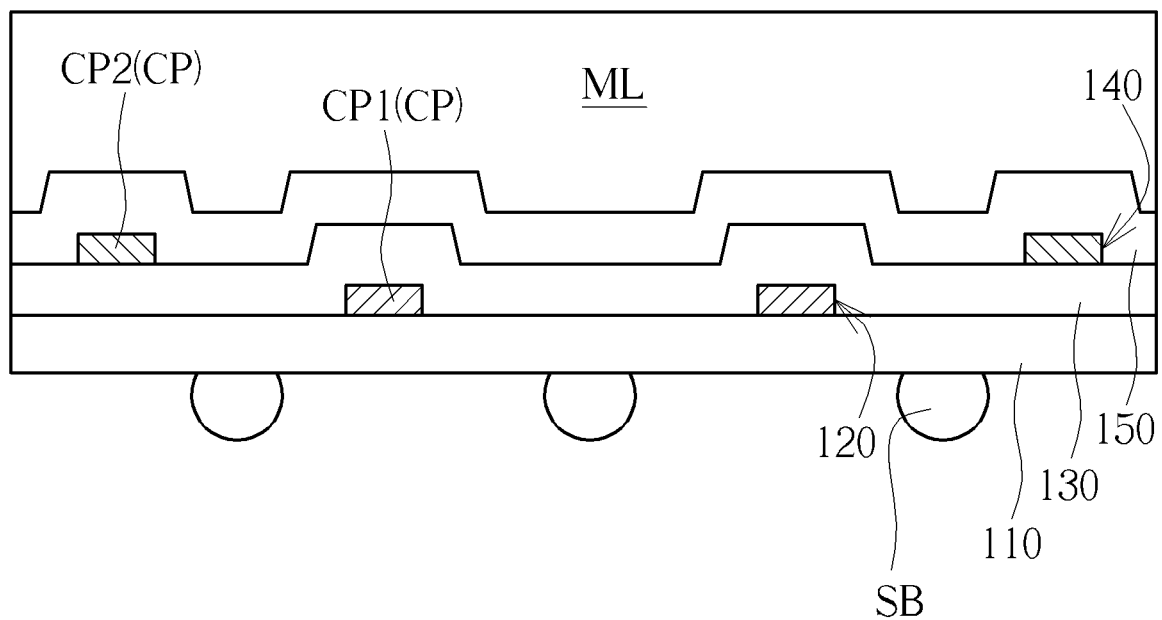
FIG. 6 is a schematic diagram showing a cutting plane of the package structure cutting the switch circuit portion according to the fourth embodiment of the present disclosure.

Referring to FIG. 5, FIG. 5 is a schematic diagram showing a cross-section of a package structure according to a fourth embodiment of the present disclosure. As shown in FIG. 5, compared to the first embodiment, the encapsulation layer ML of the package structure 400 of this embodiment covers the die 190 and the redistribution portion RDP, and the encapsulation layer ML does not cover at least a portion of the switch circuit portion SWP. Because at least a portion of the switch circuit portion SWP is not covered by the encapsulation layer ML, in the design of the testing connecting pads 184', the testing connecting pads 184' may be formed of the conductive films in the redistribution layer RDL, such as be formed of the first conductive layer 120 and the fourth conductive layer 170 shown in FIG. 5. The third insulating layer 150 and the second insulating layer 130 have the openings for exposing the first conductive layer 120 of the testing connecting pads 184', such that the test probes may be in contact with the testing connecting pads 184' from the side of the redistribution layer RDL facing the die 190 when testing, but the present disclosure is not limited thereto. In another embodiment, the design of the testing connecting pads may be the same as the first embodiment. Furthermore, in this embodiment, a cutting process may be performed after testing the die 190, so as to cut the portion of the switch circuit portion SWP which is not covered by the encapsulation layer ML. The transistor T, the passive component or the testing connecting pad 184' which is not covered by the encapsulation layer ML may be cut after testing; that is to say, at least a portion of circuit is configured to test the die 190 only. Note that the transistor T is cut after testing, and therefore, in this embodiment, the testing connecting pads 184' may be for example the input and output ends shown in FIG. 2. The testing connecting pads 184' may not be electrically connected to the outer connecting pad 182; that is to say, each of the outer connecting pads 182 may be electrically connected to one of bonding pads 192 of the die 190 only. In this design, the cost of the test may be reduced, the test difficulty may be lowered or the alignment accuracy of the test probes may be enhanced during testing the die 190 of the package structure 400. Referring to FIG. 6, FIG. 6 is a schematic diagram showing a cutting plane of the package structure cutting the switch circuit portion according to the fourth embodiment of the present disclosure. In FIG. 6, after the cutting process is performed, the cutting plane of the package structure 400 exposes the conductive films, such as the conductive patterns CP electrically connected between the transistor T and the die 190. The first conductive pattern CP1 and the second conductive pattern CP2 is exposed in FIG. 6 for instance.

After cutting the portion of circuit configured for testing, the size of the package structure 400 may be reduced.

Figure 7:
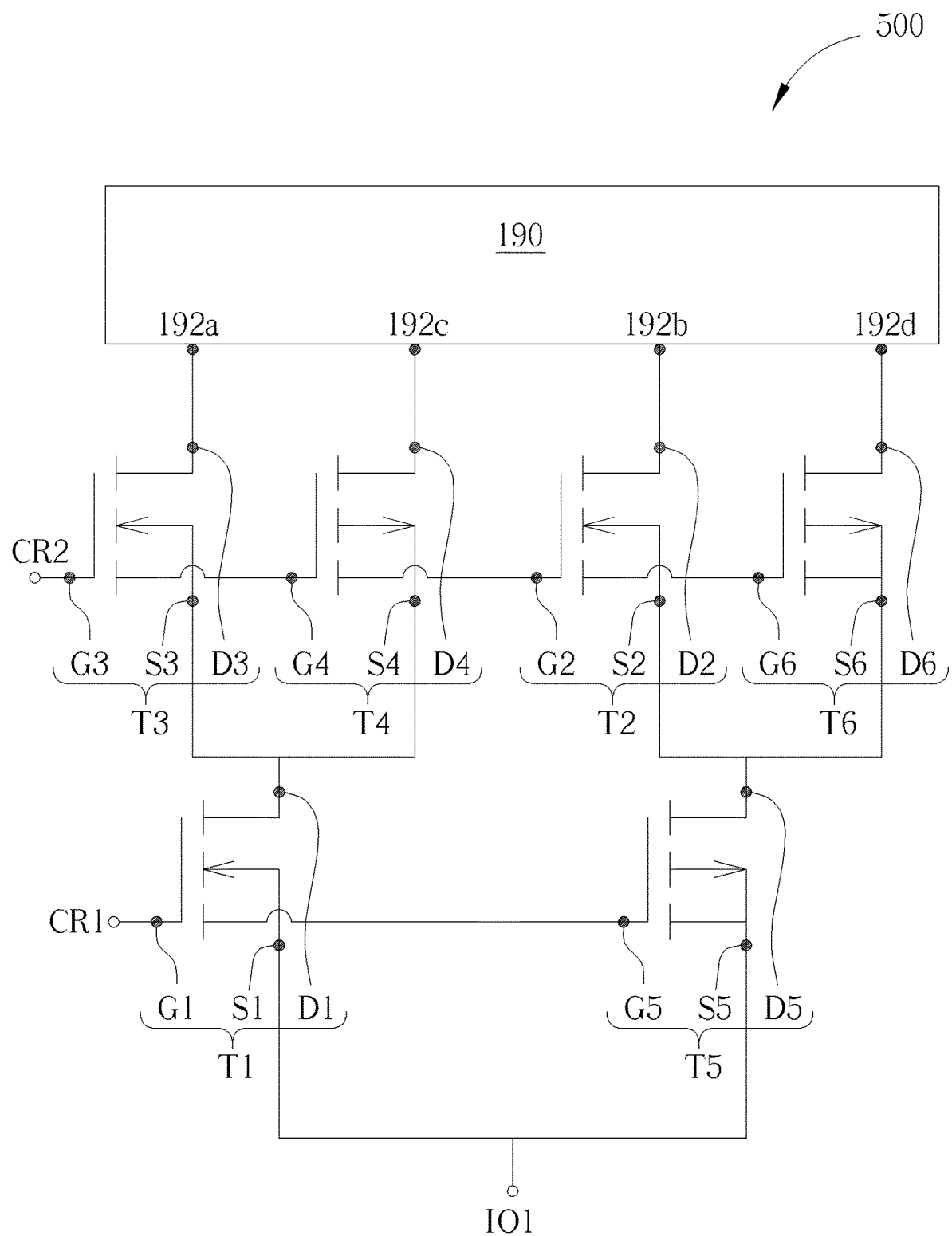
FIG. 7 is a schematic diagram showing a circuit of a package structure according to a fifth embodiment of the present disclosure.

Referring to FIG. 7, FIG. 7 is a schematic diagram showing a circuit of a package structure according to a fifth embodiment of the present disclosure. As shown in FIG. 7, compared to the circuit of the first embodiment, the package structure 500 of this embodiment further includes a third transistor T3, a fourth transistor T4, a fifth transistor T5 and a sixth transistor T6 disposed within the switch circuit portion SWP of the redistribution layer RDL. For example, the transistor T shown in FIG. 1 may be one of the third transistor T3, the fourth transistor T4, the fifth transistor T5 and the sixth transistor T6, but the present disclosure is not limited thereto. The die ends of the die 190 further include a third die end 192*c* and a fourth die end 192*d*. Each of the third transistor T3, the fourth transistor T4, the fifth transistor T5 and the sixth transistor T6 includes a switch control end, a first end and a second end, and the switch control ends, the first ends and the second ends of this embodiment are gates, drains and sources respectively for example, but the present disclosure is not limited thereto. In another embodiment, the switch control ends, the first ends and the second ends may be gates, sources and drains respectively. In this embodiment, the gate G3 of the third transistor T3 is electrically connected to the second control node CR2, the drain D3 of the third transistor T3 is electrically connected to the first die end 192*a*, and the source S3 of the third transistor T3 is electrically connected to the drain D1 of the first transistor T1, such that the drain D1 of the first transistor T1 may be electrically connected to the first die end 192*a* through the third transistor T3. The gate G4 of the fourth transistor T4 is electrically connected to the second control node CR2, the drain D4 of the fourth transistor T4 is electrically connected to the third die end 192*c*, and the source S4 of the fourth transistor T4 is electrically connected to the drain D1 of the first transistor T1, such that the drain D1 of the first transistor T1 may be further electrically connected to the third die end 192*c* through the fourth transistor T4. The gate G5 of the fifth transistor T5 is electrically connected to the first control node CR1, the drain D5 of the fifth transistor T5 is electrically connected to the source S2 of the second transistor T2, and the source S5 of the fifth transistor T5 is electrically connected to the first input and output end IO1, such that the source S2 of the second transistor T2 may be electrically connected to the first input and output end IO1 through the fifth transistor T5. The gate G6 of the sixth transistor T6 is electrically connected to the second control node CR2, the drain D6 of the sixth transistor T6 is electrically connected to the fourth die end 192*d*, and the source S6 of the sixth transistor T6 is electrically connected to the drain D5 of the fifth transistor T5 and the source S2 of the second transistor T2, such that the drain D5 of the fifth transistor T5 may be electrically connected to the fourth die end 192*d* through the sixth transistor T6. Therefore, the first die end 192*a*, the second die end 192*b*, the third die end 192*c* and the fourth die end 192*d* of this embodiment are electrically connected to the first input and output end IO1; that is to say, four bonding pads 192 of the die 190 are electrically connected to the same outer connecting pad 182. In this embodiment, a conductive type of the first transistor T1 is different from a conductive type of the fifth transistor T5, such as when the first transistor T1 is an N-type transistor, the fifth transistor T5 is a P-type transistor, or they may exchange the conductive types. A conductive type of the third transistor T3 is different from a conductive type of the fourth transistor T4, such as when the third transistor T3 is an N-type transistor, the fifth transistor T5 is a P-type transistor, or they may exchange the conductive typed. A conductive type of the second transistor T2 is different from a conductive type of the sixth transistor T6, such as when the second transistor T2 is an N-type transistor, the sixth transistor T6 is a P-type transistor, or they may exchange the conductive types. For example, in FIG. 7, the first transistor T1, the second transistor T2 and the third transistor T3 may be the N-type transistors, and the fourth transistor T4, the fifth transistor T5 and the sixth transistor T6 may be the P-type transistors, but the present disclosure is not limited thereto. In FIG. 7, note that the first control node CR1 controls the switches of the first transistor T1 and the fifth transistor T5, and the second control node CR2 controls the switches of the second transistor T2, the third transistor T3, the fourth transistor T4 and the sixth transistor T6, and therefore, the signal provided from the second control node CR2 may turn on one of the third transistor T3 and the fourth transistor T4 and turn off the other owing to the different conductive types of the third transistor T3 and the fourth transistor T4, such that the signal provided from the second control node CR2 may determine that the drain D1 of the first transistor T1 is conductive with the first die end 192*a* or the third die end 192*c*. Similarly, the signal provided from the second control node CR2 may also turn on one of the second transistor T2 and the sixth transistor T6 and turn off the other, thereby determining the drain D5 of the fifth transistor T5 is conductive with the second die end 192*b* or the fourth die end 192*d*. Furthermore, the signal provided from the first control node CR1 may turn on one of the first transistor T1 and the fifth transistor T5 and turn off the other, thereby determining the first input and output end IO1 is conductive with one of the third transistor T3 and the fourth transistor T4 or is conductive with one of the second transistor T2 and the sixth transistor T6. In this embodiment, according to the design of the circuit described above, the signals from the same outer connecting pad 182 representing the first input and output end IO1 may be selectively inputted to four bonding pads 192 of the die 190 respectively representing the first die end 192*a*, the second die end 192*b*, the third die end 192*c* and the fourth die end 192*d*, or the signal provided from the first die end 192*a*, the signal provided from the second die end 192*b*, the signal provided from the third die end 192*c* and the signal provided from the fourth die end 192*d* may be selectively outputted to the same outer connecting pad 182, so as to reduce the number of the outer connecting pads 182, thereby shrinking the size of the package structure 500, reducing the cost of the test, decreasing the test difficulty or increasing alignment accuracy of the test probes. In another embodiment, the circuit of the package structure of the fifth embodiment may be suitable for the package structures of the second embodiment, the third embodiment and the fourth embodiment.

In addition, in the present disclosure, circuit having the selective function is not limited to the embodiment described above. In another embodiment, one input and output end may be electrically connected to three, five, ten, or other suitable numbers of the die ends (the bonding pads 192 of the die 190) by a plurality of transistors T, and the operation of the circuits may be different depending on the design of the circuits. Thus, the operation of the circuits is not limited to the embodiment described above also.

Figure 8:
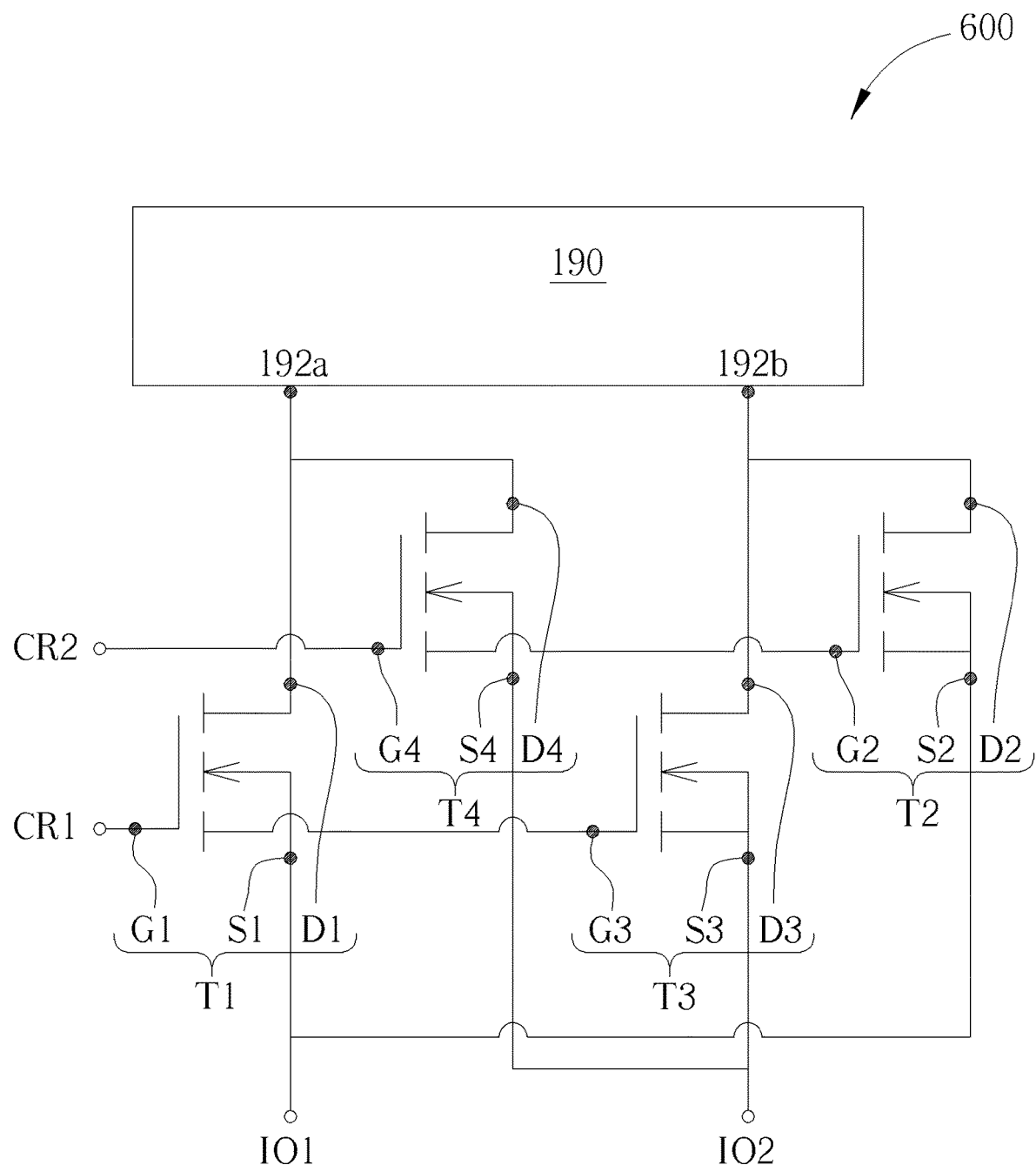
FIG. 8 is a schematic diagram showing a circuit of a package structure according to a sixth embodiment of the present disclosure.

Referring to FIG. 8, FIG. 8 is a schematic diagram showing a circuit of a package structure according to a sixth embodiment of the present disclosure. As shown in FIG. 8, compared to the circuit of the first embodiment, the package structure 600 of this embodiment further includes a third transistor T3 and a fourth transistor T4 disposed within the switch circuit portion SWP of the redistribution layer RDL. For instance, the transistor T shown in FIG. 1 may be one of the third transistor T3 and the fourth transistor T4. The at least one input and output end further includes a second input and output end IO2. Each of the third transistor T3 and the fourth transistor T4 includes a switch control end, a first end and a second end, and the switch control ends, the first ends and the second ends of this embodiment are respectively gates, drains and sources for example, but the present disclosure is not limited thereto. In another embodiment, the switch control ends, the first ends and the second ends may be gates, sources and drains respectively. In this embodiment, the gate G3 of the third transistor T3 is electrically connected to the first control node CR1, the drain D3 of the third transistor T3 is electrically connected to the second die end 192b, and the source S3 of the third transistor T3 is electrically connected to the second input and output end IO2; the gate G4 of the fourth transistor T4 is electrically connected to the second control node CR2, the drain D4 of the fourth transistor T4 is electrically connected to the first die end 192a, and the source S4 of the fourth transistor T4 is electrically connected to the second input and output end IO2. Therefore, the first die end 192a and the second die end 192b of this embodiment are electrically connected to the second input and output end IO2; that is, each of two bonding pads 192 of the die 190 is electrically connected to the same two outer connecting pads 182. In this embodiment, the first transistor T1 and the third transistor T3 may be N-type transistors for example, and the second transistor T2 and the fourth transistor T4 may be N-type transistors for example also, but the present disclosure is not limited thereto. In this circuit, when the control module provides the first control node CR1 with a turn-on signal and provides the second control node CR2 with a turn-off signal, the first transistor T1 and the third transistor T3 would turn on and the second transistor T2 and the fourth transistor T4 would turn off, such that the first die end 192a is conductive with the first input and output end IO1, and the second die end 192b is conductive with the second input and output end IO2; when the control module provides the first control node CR1 a turn-off signal and provides the second control node CR2 a turn-on signal, the second transistor T2 and the fourth transistor T4 would turn on and the first transistor T1 and the third transistor T3 would turn off, such that the first die end 192a is conductive with the second input and output end IO2, and the second die end 192b is conductive with the first input and output end IO1. Thus, the conductive relation between the bonding pads 192 and the outer connecting pads 182 may be exchanged, such that the package structure 600 doesn't need to be redesigned or be produced again, thereby reducing the manufacturing cost. In another embodiment, the circuit of the package structure of the sixth embodiment may be suitable for the package structures of the second embodiment, the third embodiment and the fourth embodiment.

Figure 9:
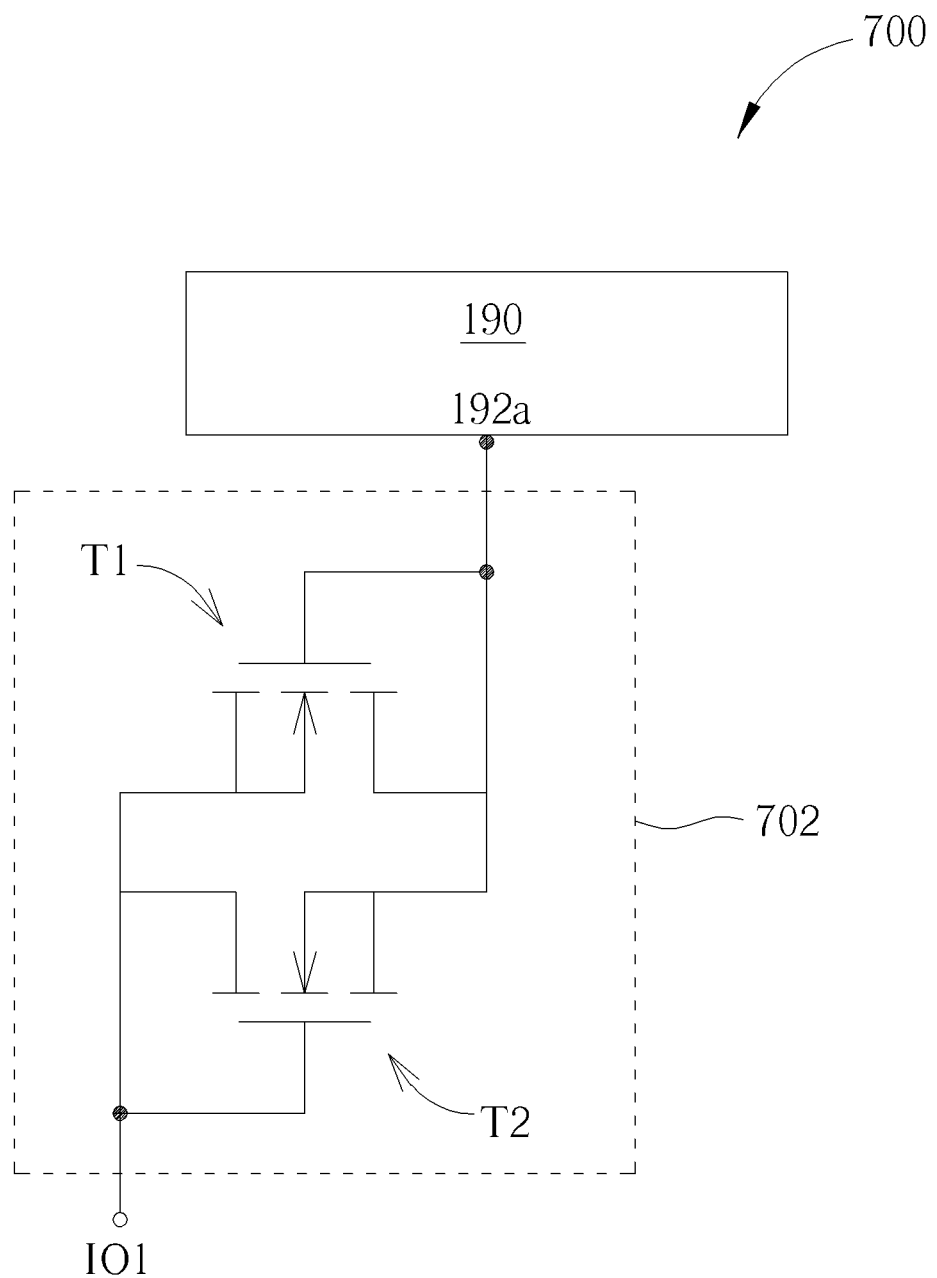
FIG. 9 is a schematic diagram showing a circuit of a package structure according to a seventh embodiment of the present disclosure.

Referring to FIG. 9, FIG. 9 is a schematic diagram showing a circuit of a package structure according to a seventh embodiment of the present disclosure. As shown in FIG. 9, in this embodiment, the switch circuit portion SWP of the package structure 700 includes an electrostatic protecting circuit 702 electrically connected between the die 190 and the first input and output end IO1, and the electrostatic protecting circuit 702 is configured to prevent static charges from the first input and output end IO1 from destroying the die 190. For instance, the electrostatic protecting circuit 702 includes the first transistor T1 and the second transistor T2, and the first transistor T1 and the second transistor T2 may be the same as the transistor T shown in FIG. 1; that is, the transistor T shown in FIG. 1 may be one of the first transistor T1 and the second transistor T2 shown in FIG. 9. Note that the electrostatic protecting circuit shown in FIG. 9 is an example, but the electrostatic protecting circuit of the present disclosure is not limited thereto. In this embodiment, the gate and the drain of the first transistor T1 may be electrically connected to the die ends (such as the first die end 192a) of the die 190, the source of the first transistor T1 may be electrically connected to the input and output end (such as the first input and output end IO1), the gate and the drain of the second transistor T2 may be electrically connected to the input and output end (such as the first input and output end IO1), and the source of the second transistor T2 may be electrically connected to the die ends (such as the first die end 192a) of the die 190, so as to form a circuit having a back to back diode, thereby preventing the damage of the static charges and protecting the die 190. Thus, the circuit in the switch circuit portion SWP is not limited to the circuits of the first embodiment, the fifth embodiment and the sixth embodiment having the selective function or the exchanging function, and the circuit in the switch circuit portion SWP may be the electrostatic protecting circuit of the seventh embodiment or other circuit having the transistor T. In another embodiment, the package structure having the electrostatic protecting circuit may also have the circuit having the selective function or the exchanging function, such as the circuit of the first embodiment, the fifth embodiment or the sixth embodiment.

In summary, since the redistribution layer of the package structure of the present disclosure includes the switch circuit portion having the transistor, the number of the outer connecting pads may be reduced, the size of the package structure may be shrunk, the cost of the test or manufacture may be decreased, the alignment accuracy of the test probes may be increased, the test accuracy may be enhanced, or the electrostatic protecting effect may be provided.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. A package structure, comprising:
 a redistribution layer comprising:
  a switch circuit portion comprising a transistor, wherein the transistor comprises a semiconductor layer;
  a redistribution portion adjacent to the switch circuit portion, wherein the redistribution portion comprises a plurality of conductive patterns, and a thickness of the semiconductor layer is different from a thickness of at least one of the conductive patterns; and
  a first insulating layer disposed below the at least one of the conductive patterns;
 a die overlapping the redistribution portion;
 at least one outer connecting pad disposed at a side of the redistribution layer opposite to the die; and
 at least one solder ball disposed on the at least one outer connecting pad,
 wherein the transistor is electrically connected to the die, in a cross sectional view, the at least one outer connecting pad is electrically connected to the at least one of the conductive patterns, and the first insulating layer is disposed between the at least one outer connecting pad and the at least one of the conductive patterns.

2. The package structure of claim 1, wherein the transistor further comprises:
an insulating layer, wherein the semiconductor layer is disposed on the insulating layer; and
a conductive layer disposed on the insulating layer,
wherein at least one of the conductive patterns of the redistribution portion comprises a same material as the conductive layer.

3. The package structure of claim 2, wherein at least one of the conductive patterns of the redistribution portion has a same material as the semiconductor layer.

4. The package structure of claim 2, wherein the switch circuit portion further comprises a passive component.

5. The package structure of claim 4, wherein the passive component is a capacitor, the capacitor has an electrode, and a material of the electrode comprises the same material as the conductive layer.

6. The package structure of claim 1, wherein the transistor further comprises:
a conductive layer; and
an insulating layer disposed on the conductive layer, wherein the semiconductor layer is disposed on the insulating layer,
wherein at least one of the conductive patterns of the redistribution portion comprises a same material as the conductive layer.

7. The package structure of claim 6, wherein at least one of the conductive patterns of the redistribution portion and the conductive layer are formed of a same film.

8. The package structure of claim 1, wherein the die overlaps the switch circuit portion.

9. The package structure of claim 1, further comprising an encapsulation layer covering the die and the redistribution portion.

10. The package structure of claim 9, wherein the encapsulation layer covers the switch circuit portion.

11. The package structure of claim 1, wherein the redistribution portion further comprises a plurality of conductive pads disposed to face the die and configured to be bonded with the die.

12. The package structure of claim 1, wherein the switch circuit portion further comprises an electrostatic protecting circuit, and the electrostatic protecting circuit comprises the transistor.

13. A package structure, comprising:
a die comprising a plurality of die ends, wherein the die ends comprise a first die end and a second die end;
a first transistor comprising a switch control end, a first end and a second end, wherein the first end of the first transistor is electrically connected to the first die end;
a second transistor comprising a switch control end, a first end and a second end, wherein the first end of the second transistor is electrically connected to the second die end;
a first control node electrically connected to the switch control end of the first transistor;
a second control node electrically connected to the switch control end of the second transistor; and
at least one input and output end comprising a first input and output end, wherein the first input and output end is electrically connected to the second end of the first transistor and the second end of the second transistor.

14. The package structure of claim 13, further comprising:
a third transistor comprising a switch control end, a first end and a second end, wherein the switch control end of the third transistor is electrically connected to the first control node, and the first end of the third transistor is electrically connected to the second die end; and
a fourth transistor comprising a switch control end, a first end and a second end, wherein the switch control end of the fourth transistor is electrically connected to the second control node, and the first end of the fourth transistor is electrically connected to the first die end;
wherein the at least one input and output end further comprises a second input and output end electrically connected to the second end of the third transistor and the second end of the fourth transistor.

15. The package structure of claim 13, wherein the die ends further comprise a third die end and a fourth die end, and the package structure further comprises:
a third transistor comprising a switch control end, a first end and a second end, wherein the third transistor is electrically connected between the first die end and the first end of the first transistor, and the switch control end of the third transistor is electrically connected to the second control node;
a fourth transistor comprising a switch control end, a first end and a second end, wherein the fourth transistor is electrically connected between the third die end and the first end of the first transistor, and the switch control end of the fourth transistor is electrically connected to the second control node;
a fifth transistor comprising a switch control end, a first end and a second end, wherein the fifth transistor is electrically connected between the second end of the second transistor and the first input and output end, and the switch control end of the fifth transistor is electrically connected to the first control node; and
a sixth transistor comprising a switch control end, a first end and a second end, wherein the sixth transistor is electrically connected between the fourth die end and the fifth transistor, and the switch control end of the sixth transistor is electrically connected to the second control node.

16. The package structure of claim 15, wherein a conductive type of the first transistor is different from a conductive type of the fifth transistor.

17. The package structure of claim 15, wherein a conductive type of the third transistor is different from a conductive type of the fourth transistor.

18. The package structure of claim 15, wherein a conductive type of the second transistor is different from a conductive type of the sixth transistor.

19. The package structure of claim 13, wherein an amount of the at least one input and output end is less than an amount of the die ends of the die.

* * * * *